(12) United States Patent
Shin et al.

(10) Patent No.: US 10,193,029 B2
(45) Date of Patent: *Jan. 29, 2019

(54) LIGHT CONVERSION DEVICE AND DISPLAY DEVICE COMPRISING SAME

(71) Applicant: LG CHEM, LTD., Seoul (KR)

(72) Inventors: Du Hyeon Shin, Daejeon (KR); Sehwan Son, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/538,978

(22) PCT Filed: Feb. 1, 2016

(86) PCT No.: PCT/KR2016/001090
§ 371 (c)(1),
(2) Date: Jun. 22, 2017

(87) PCT Pub. No.: WO2016/122286
PCT Pub. Date: Aug. 4, 2016

(65) Prior Publication Data
US 2017/0373229 A1    Dec. 28, 2017

(30) Foreign Application Priority Data

Jan. 31, 2015    (KR) ........................ 10-2015-0015703

(51) Int. Cl.
| | | |
|---|---|---|
| *H01L 33/50* | (2010.01) | |
| *F21V 9/16* | (2006.01) | |
| *B82Y 10/00* | (2011.01) | |
| *H01L 33/56* | (2010.01) | |
| *G02B 1/14* | (2015.01) | |
| *F21V 9/30* | (2018.01) | |
| *C09K 11/77* | (2006.01) | |
| *C09K 11/88* | (2006.01) | |
| *C09K 11/06* | (2006.01) | |
| *G02B 1/04* | (2006.01) | |
| *F21Y 113/10* | (2016.01) | |
| *F21Y 115/10* | (2016.01) | |

(52) U.S. Cl.
CPC .............. *H01L 33/50* (2013.01); *B82Y 10/00* (2013.01); *C09K 11/06* (2013.01); *C09K 11/7706* (2013.01); *C09K 11/883* (2013.01); *F21V 9/30* (2018.02); *G02B 1/04* (2013.01); *G02B 1/14* (2015.01); *H01L 33/56* (2013.01); *F21Y 2113/10* (2016.08); *F21Y 2115/10* (2016.08)

(58) Field of Classification Search
None
See application file for complete search history.

(56) References Cited

U.S. PATENT DOCUMENTS

| | | |
|---|---|---|
| 6,501,102 B2 | 12/2002 | Mueller-Mach et al. |
| 9,711,665 B2 | 7/2017 | Wagenblast et al. |
| 2002/0003233 A1 | 1/2002 | Mueller-Mach et al. |

(Continued)

FOREIGN PATENT DOCUMENTS

| | | |
|---|---|---|
| CN | 103503179 A | 1/2014 |
| CN | 104206018 A | 12/2014 |

(Continued)

*Primary Examiner* — Ashok Patel
(74) *Attorney, Agent, or Firm* — Dentons US LLP

(57) ABSTRACT

This application relates to a light conversion device and a display device.

9 Claims, 11 Drawing Sheets

(56) References Cited

U.S. PATENT DOCUMENTS

| | | |
|---|---|---|
| 2003/0042845 A1 | 3/2003 | Pires et al. |
| 2006/0081862 A1 | 4/2006 | Chua et al. |
| 2006/0138938 A1* | 6/2006 | Tan .................. C09K 11/06 313/503 |
| 2008/0246017 A1 | 10/2008 | Gillies et al. |
| 2010/0238381 A1 | 9/2010 | Oshima et al. |
| 2011/0217530 A1 | 9/2011 | Maier-Richter et al. |
| 2012/0156436 A1 | 6/2012 | Kim et al. |
| 2014/0077247 A1 | 3/2014 | Hikmet et al. |
| 2014/0097461 A1 | 4/2014 | Ito et al. |
| 2015/0054401 A1 | 2/2015 | Vam Bommel et al. |
| 2015/0085490 A1* | 3/2015 | Miller .................. C09K 11/02 362/259 |
| 2015/0252963 A1 | 9/2015 | Stoll et al. |
| 2015/0301257 A1 | 10/2015 | Choi et al. |
| 2018/0004041 A1* | 1/2018 | Shin .................. G02F 1/133603 |
| 2018/0016490 A1* | 1/2018 | Shin .................. C09K 11/025 |

FOREIGN PATENT DOCUMENTS

| | | |
|---|---|---|
| JP | 2003-151773 A | 5/2003 |
| JP | 2010-225373 A | 10/2010 |
| JP | 2011-241160 A | 12/2011 |
| JP | 2013-032515 A | 2/2013 |
| JP | 2013-544018 A | 12/2013 |
| JP | 2014-038702 A | 2/2014 |
| JP | 2014-519191 A | 8/2014 |
| JP | 2015-532501 A | 11/2015 |
| KR | 10-2001-0089509 A | 10/2001 |
| KR | 10-2009-0069894 A | 7/2009 |
| KR | 10-2011-0048588 A | 5/2011 |
| KR | 10-2012-0067167 A | 6/2012 |
| KR | 10-2014-0143060 A | 12/2014 |
| KR | 10-2014-0144167 A | 12/2014 |
| WO | 2012/064562 A1 | 5/2012 |
| WO | 2013/133139 A1 | 9/2013 |
| WO | 2017/126052 A1 | 7/2017 |

* cited by examiner

[Figure 1]
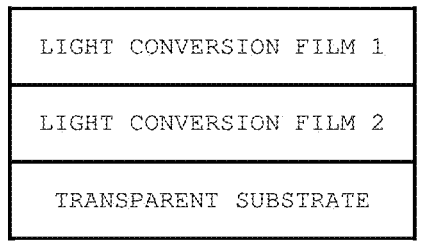
[Figure 2]
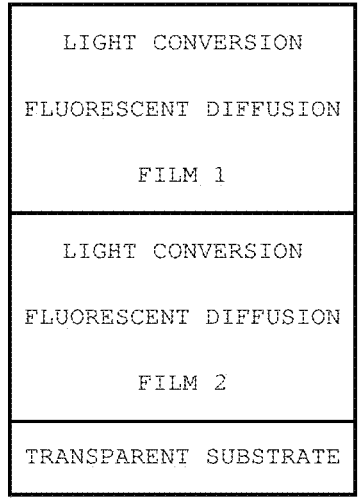

[Figure 3]
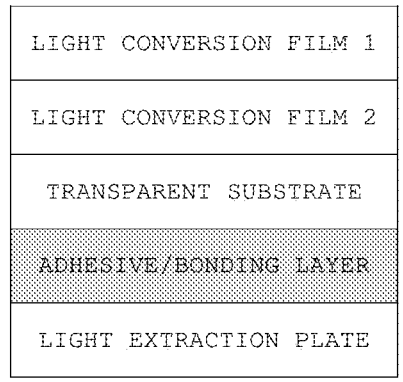
[Figure 4]
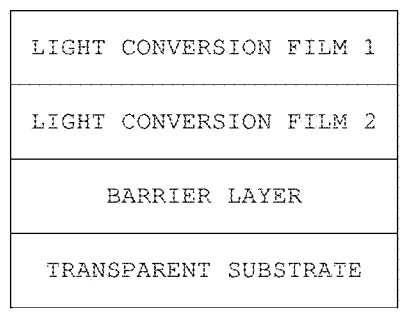

[Figure 5]
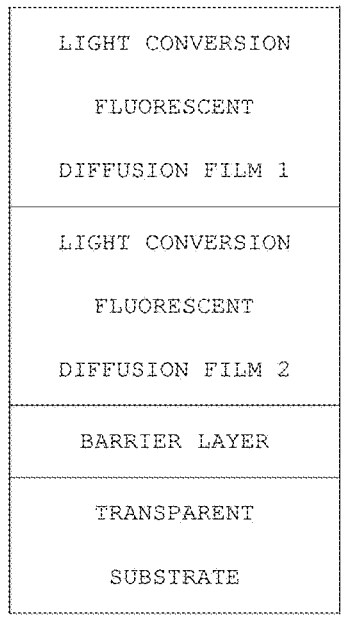
[Figure 6]
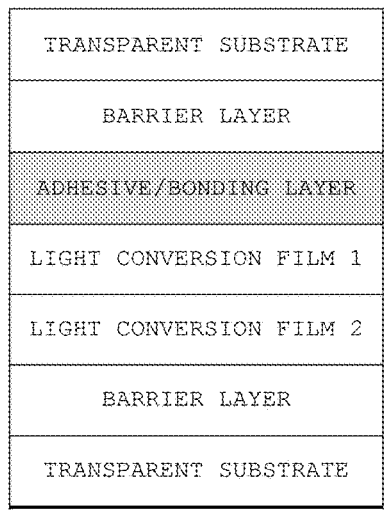

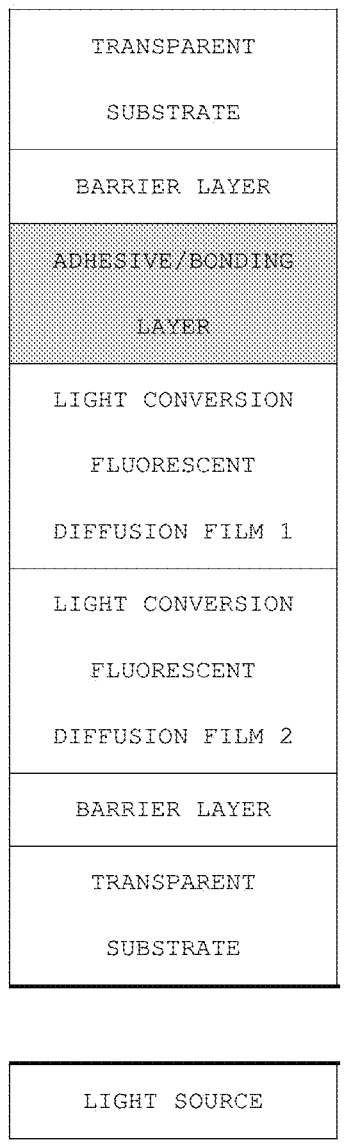

[Figure 8]
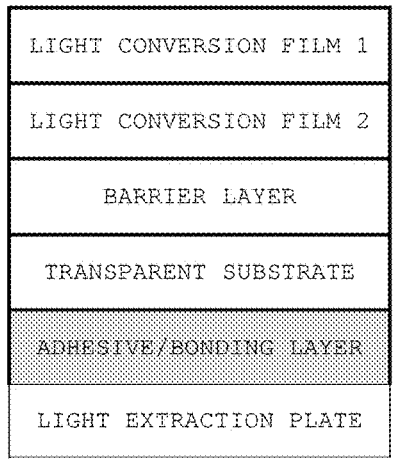
[Figure 9]
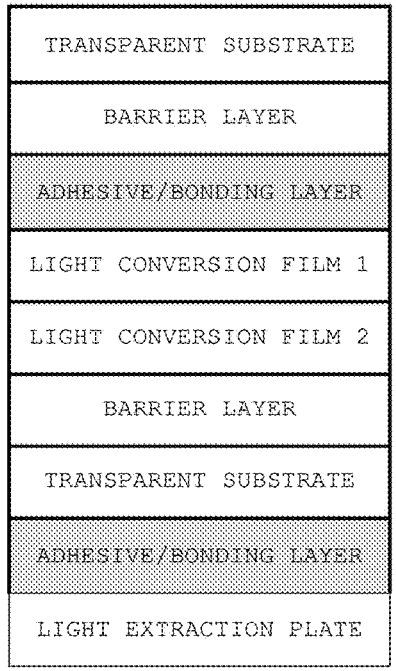

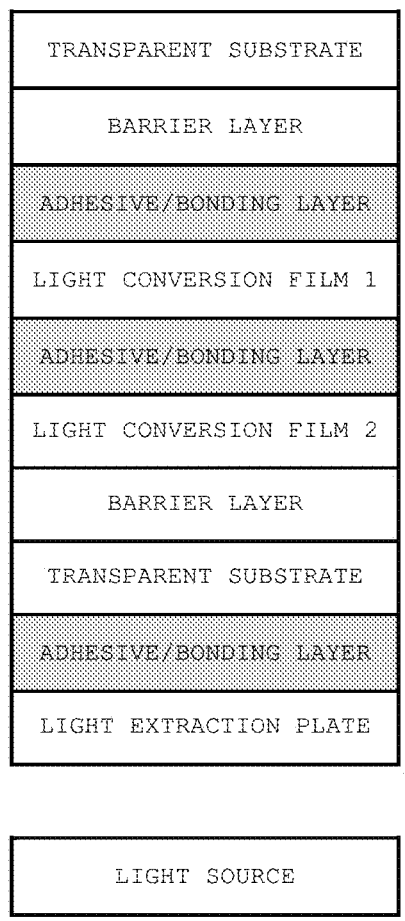
[Figure 10]

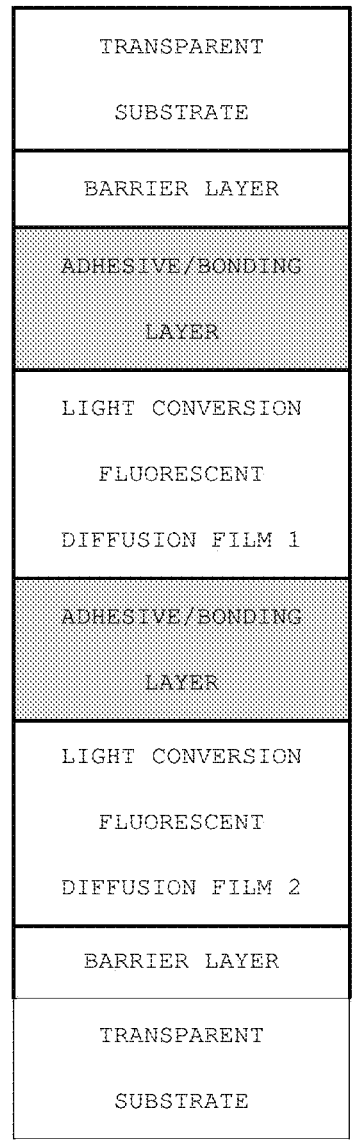
[Figure 11]

[Figure 12]
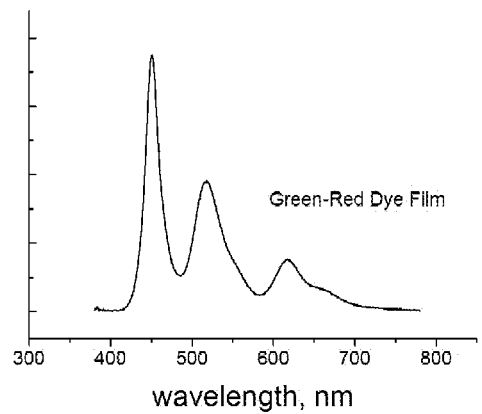
[Figure 13]
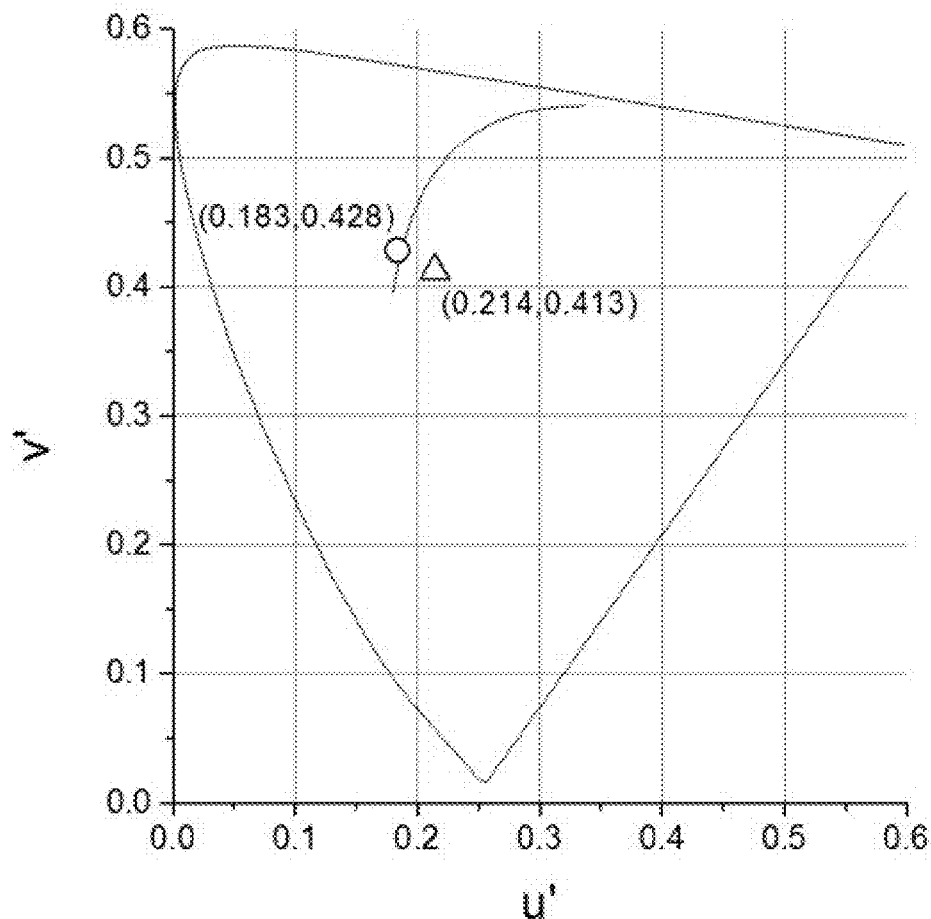

[Figure 14]
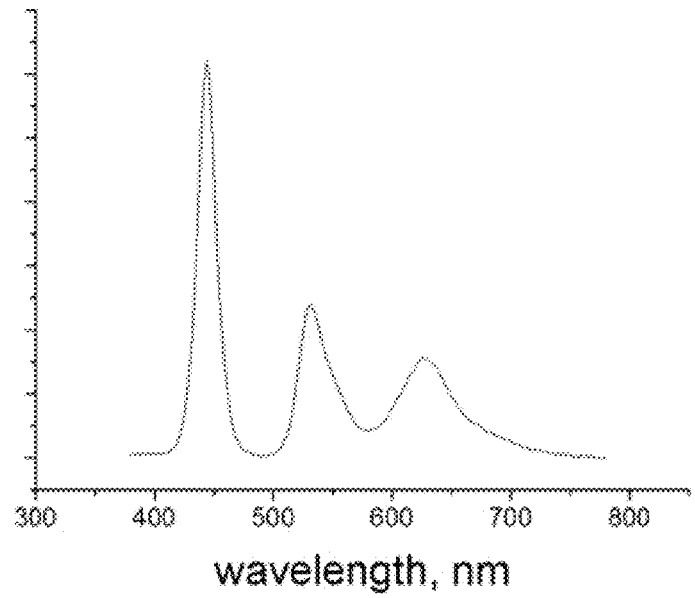
[Figure 15]
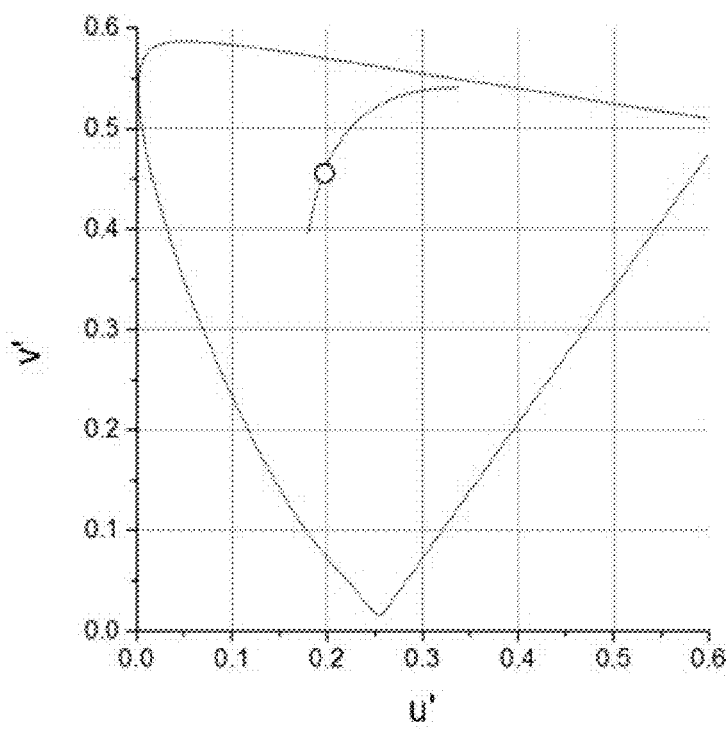

[Figure 16]
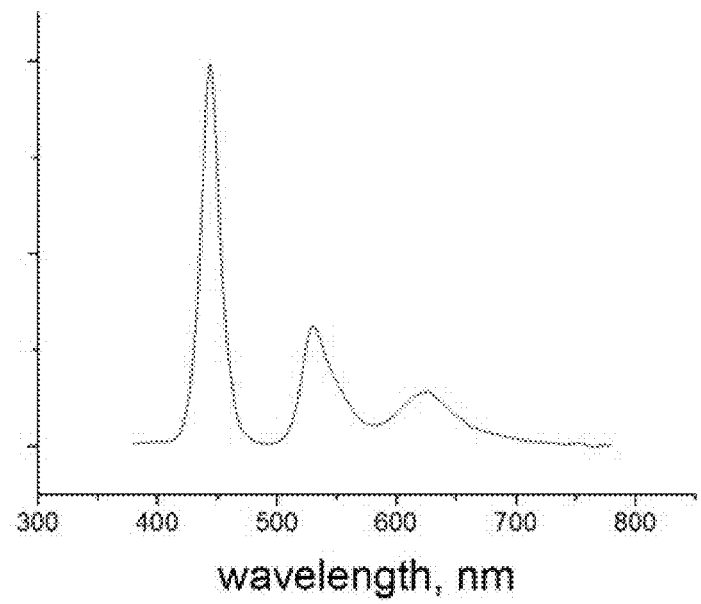
[Figure 17]
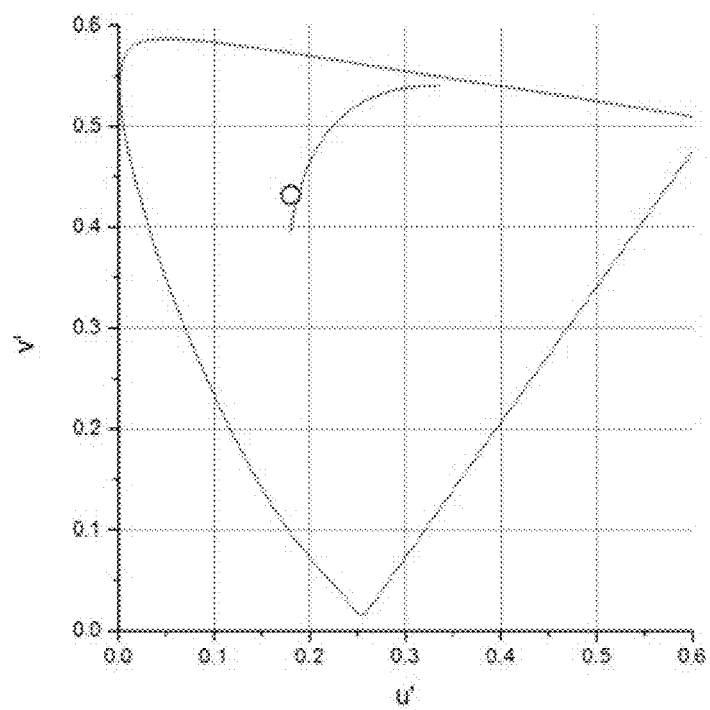

[Figure 18]
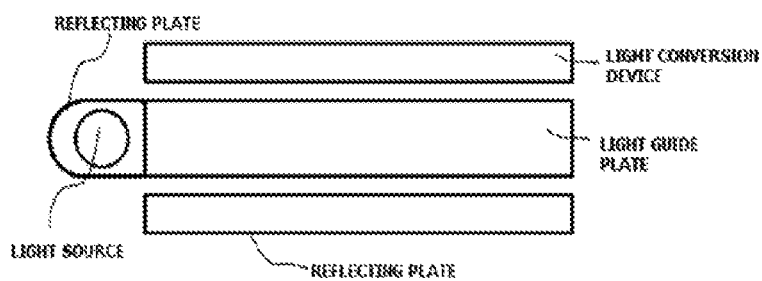
[Figure 19]
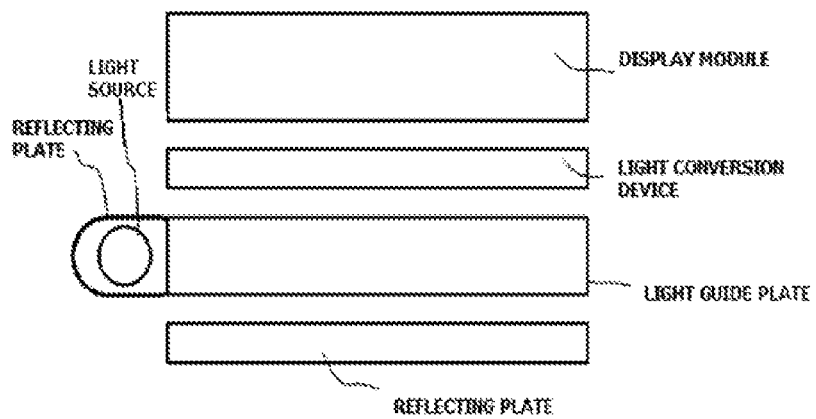

LIGHT CONVERSION DEVICE AND DISPLAY DEVICE COMPRISING SAME

TECHNICAL FIELD

The present invention relates to a light conversion device and a display device. This application is a National Stage Application of International Application No. PCT/KR2016/001090 filed on Feb. 1, 2016, which claims the benefit of Korean Patent Application No. 10-2015-0015703 filed on Jan. 31, 2015, all of which are hereby incorporated by reference in their entirety for all purposes as if fully set forth herein.

BACKGROUND ART

Generally, a fluorescent substance is a luminescent material that absorbs energy from the outside in a form of light or electricity to emit light of a unique wavelength and may be classified into an inorganic fluorescent substance, an organic fluorescent dye, and a nanocrystal fluorescent substance according to components constituting the fluorescent substance and a light emitting device.

Recently, various efforts to modify a spectrum of a light source by utilizing such fluorescent substances have been attempted. The fluorescent substance absorbs a part of a specific wavelength of the light emitted from the light source and converts and emits the part of the light into light having a longer wavelength in a visible light region, thereby largely improving brightness, color purity, and color reproducibility of the emitted light depending on emission characteristics of the fluorescent substance.

The inorganic fluorescent substance is composed of a matrix, such as a sulfide, an oxide, and a nitride, and activator ions and has excellent physical and chemical stability and may reproduce high color purity to be applied to a high-quality display device, but there are disadvantages in that the prices of the fluorescent substances are expensive, emission efficiency is low, and particularly, development of fluorescent substances which are excited in a near ultraviolet or blue region of 400 nm or more to emit light is limited.

A fluorescent wavelength of a nanocrystal fluorescent substance consisting of II-IV group or III-V group semiconductor particles with sizes of several nanometers varies according to a size of the particle unlike the organic fluorescent dye, and as the size of the particle is decreased, light having a short wavelength is emitted, and all of visible light regions having a desired wavelength may be expressed by controlling the size. Further, since the nanocrystal fluorescent substance has an extinction coefficient 100 to 1000 times higher than a general organic dye and higher quantum efficiency than the general organic dye, the nanocrystal fluorescent substance generates very strong fluorescence, and particularly, since only the transition from a ground vibration state of a conduction band to a ground vibration state of a valence band is observed, the fluorescent wavelength shows almost monochromatic light. However, there are disadvantages in that it is difficult to secure price competitiveness due to high raw material prices, and particularly, the nanocrystal fluorescent substance is vulnerable to heat and oxygen.

On the other hand, the organic fluorescent dye has advantages of various emission spectra, excellent quantum efficiency, and particularly low cost as compared with the inorganic fluorescent substance to be well worth being used as a light conversion device. However, in order to increase conversion efficiency of the light passing through the organic fluorescent dye and intensity of the converted light, the concentration needs to be increased, and in this case, it is known that an extinction phenomenon due to the concentration can not be avoided and particularly, stability against heat or light is deteriorated.

DETAILED DESCRIPTION OF THE INVENTION

Technical Problem

The present invention has been made in an effort to provide a light conversion device with excellent durability and conversion efficiency, including an organic fluorescent dye and a display device including the same.

Technical Solution

An exemplary embodiment of the present invention provides a light conversion device including: a light source; and a light conversion film provided on one surface of the light source, wherein the light conversion film includes a first light conversion film containing one or more organic fluorescent dyes, and a second light conversion film disposed to be closer to the light source than the first light conversion film and containing one or more organic fluorescent dyes, and a maximum light emission wavelength of the second light conversion film is smaller than a maximum light emission wavelength of the first light conversion film when the light is irradiated from the light source. As such, the first and second light conversion films may convert light emitted from a light source into light having a different wavelength to convert and emit light incident from a light source such as a light emitting diode (LED) into white light.

The light conversion device may further include a transparent substrate provided on a surface facing the light source of the first light conversion film; or an opposite surface to the surface facing the first light conversion film of the second light conversion film.

The transparent substrate may be a barrier film or further include a barrier film provided on at least one surface of the first or second light conversion film. The barrier film may include a barrier layer which blocks the first or second light conversion film from external moisture or oxygen.

The barrier layer is not particularly limited so long as being a layer capable of blocking moisture or oxygen and may use barrier layers known in the art. For example, the barrier film includes a barrier layer having permeability of at least one of moisture and oxygen of $10^{-1}$ cc/m$^2$/day or less. For example, the barrier layer may include aluminum oxide or nitride, and ionic metal oxide, which give a blocking property of moisture or oxygen. The barrier film may further include a buffer layer consisting of at least one selected from sol-gel-based, acrylic-based, epoxy-based and urethane-based coating solution compositions as a buffer layer. The aforementioned transparent substrate provided on one surface of the light conversion film may serve as the buffer layer.

As an example, the barrier film may include an organic/inorganic hybrid coating layer, an inorganic layer, and a protective coating layer including inorganic nanoparticles surface-modified with an organic silane, which are provided on one side or both sides of the substrate. Herein, the inorganic layer may be made of metal oxide or nitride. The inorganic nanoparticles may be nanoparticles of alumina, silica, zinc oxide, antimony oxide, titanium oxide, or zirconium oxide. The organic/inorganic hybrid coating layer may be formed by curing a coating composition in a sol state including organosilane by heat or UV and the coating solution composition in the sol state may include appropriately an additive, a solvent, a polymerization catalyst and the like with the organosilane in some cases.

The stacked structure of the first or second light conversion film and the barrier film may be formed by coating the composition for forming the light conversion film on the barrier film or attaching the light conversion film and the barrier film by an adhesive or a bonding agent. After coating the composition, curing or drying may be performed if necessary. When the barrier film includes the buffer layer and the barrier layer, in the stacked structure of the first or second light conversion film and the barrier film, the first or second light conversion film may be disposed in contact with the barrier layer of the barrier film.

A barrier film may be provided between the first or second light conversion film and the transparent substrate. The transparent substrate may serve as the buffer layer of the barrier film. The stacked structure of the transparent substrate, the barrier film, and the first or second light conversion film may be formed by coating the composition for forming the light conversion film on the barrier film provided on the transparent substrate. The transparent substrate may serve as the buffer layer of the barrier film. In this case, the stacked structure of the transparent substrate, the barrier layer, and the first or second light conversion film may be formed.

A barrier film may be provided on an opposite surface to the surface facing the transparent substrate of the first or second light conversion film. In this case, an adhesive or bonding layer is formed between the first or second light conversion film and the barrier film to attach the first or second light conversion film and the barrier film. The barrier film may include a barrier layer and a transparent substrate as a buffer layer. In this case, a stacked structure of the first or second light conversion film, the adhesive or boding layer, the barrier layer and the transparent substrate may be formed.

The first light conversion film and the second light conversion film may include barrier films provided on surfaces opposite to the surfaces facing each other. The structure of each barrier film formed on both sides of the light conversion film may apply the description of the barrier film provided on each side of the light conversion film.

The light conversion device may include light diffusion particles which diffuse light incident from the light source in the first or second light conversion film. The light diffusion particles may be distributed in a polymer medium including one or more organic fluorescent dyes. The first or second light conversion film including the light diffusion particles may perform not only light conversion but also fluorescent diffusion and may be referred to as a first or second light conversion fluorescent diffusion film. In this specification, the light conversion film containing the light diffusion particles may be referred to as a light conversion fluorescent diffusion film.

The light diffusion particles are to enhance light conversion efficiency of the first or second light conversion film and may include TiO2 and silica nanoparticles, but materials known in the art may be used alone or in combination of two or more. An average particle size of the light diffusion particles may be 50 nm or less. The light diffusion particles may be used with the content of 0.5 to 5 wt % with respect to the weight of the polymer medium.

A barrier film may be provided on at least one surface of the first or second light conversion fluorescent diffusion film. For example, the composition for forming the light conversion fluorescent diffusion film may be coated on the barrier film to form a light conversion fluorescent diffusion film. Further, a separate barrier film may be attached onto the first or second light conversion fluorescent diffusion film using an adhesive or an adhesive layer. The description for the barrier film may apply the contents described in the first or second light conversion film.

The light conversion device may further include a light extraction plate provided on an opposite surface to the surface facing the first or second light conversion film of the transparent substrate. The transparent substrate may be a barrier film. The light extraction plate and the transparent substrate may be attached to each other by an adhesive or a bonding agent. For example, the light extraction plate and the transparent substrate may be stacked by an adhesive or an adhesive layer provided on an opposite surface to the surface facing the first or second light conversion film of the transparent substrate.

The light conversion device may further include a light extraction plate extracting light emitted when the light incident from the light source is converted through the first and second light conversion films. For example, the barrier film provided with the first or second light conversion film or the adhesive/bonding layer formed on the other surface of the transparent substrate may be stacked with one surface of the light extraction plate. The light extraction plate may be included instead of the light diffusion particles described above and may be simultaneously included with the light diffusion particles if necessary.

In order to improve extraction efficiency of the light, the light extraction plate may have a scattering structure on the surface or inside, or may include two or more kinds of materials having different refractive indexes therein. For example, the light extraction layer may be prepared by coating a composition including scattering particles and a binder on the transparent substrate, and drying or curing the composition. If necessary, a planarization layer may further be provided on the coating layer including the scattering particles and the binder. As another example, the light extraction layer may be prepared by forming an uneven structure through micro-embossing on the transparent substrate. If necessary, a planarization layer may be further provided on the uneven structure.

Advantageous Effects

According to the exemplary embodiments of the present invention, light incident from a light source including a wavelength selected in a visible light region in a near-ultraviolet range is converted into light having a specific wavelength (color) through a light conversion film containing an organic fluorescent dye, thereby improving color purity. Further, light incident from a single colored LED light source is converted into white light through light conversion films having at least two or more different emission wavelengths, for example, green and red organic fluorescent dyes, thereby improving color reproducibility and color purity of white light. In particular, since a maximum emission wavelength of the first light conversion film disposed relatively far from the light source is larger than that of the second light conversion film disposed relatively close to the light source, a part of the light converted by the second light conversion film as well as a part of the light emitted from the light source may be converted again by the first light conversion film, thereby further enhancing light conversion efficiency and thus enhancing brightness of the light passing through both the first and second light conversion films. Further, since the light conversion film is formed between the barrier films to efficiently prevent external moisture or oxygen from penetrating into the film, when the incident light is converted into a specific wavelength (color), light characteristics such as an emission wavelength, a full width at half maximum (FWHM), and conversion efficiency (quantum efficiency) may be still maintained, thereby increasing a use lifespan and uniformly maintaining brightness and a color coordinate of white light.

BRIEF DESCRIPTION OF DRAWINGS

FIGS. 1 to 11 illustrate a stacked structure of a light conversion device according to an exemplary embodiment of the present invention.

FIG. 12 illustrates a spectrum of a light conversion device of Example 1.

FIG. 13 compares a white color coordinate value (triangle) obtained from the spectrum of the light conversion device of Example 1 shown on the CIE 1976 coordinate with a white color coordinate value (circle) of a QDEF film by 3M Corporation.

FIG. 14 illustrates a spectrum of a light conversion device of Example 2.

FIG. 15 is a result illustrating a white color coordinate value obtained from the spectrum of the light conversion device of Example 2 on the CIE 1976 coordinate.

FIG. 16 illustrates a spectrum of a light conversion device of Comparative Example 1.

FIG. 17 is a result illustrating a white color coordinate value obtained from the spectrum of the light conversion device of Comparative Example 1 on the CIE 1976 coordinate.

FIG. 18 illustrates a backlight unit according to an exemplary embodiment of the present invention.

FIG. 19 illustrates a display device according to an exemplary embodiment of the present invention.

BEST MODE

Hereinafter, exemplary embodiments of the present invention will be described in more detail with reference to the accompanying drawings.

A light conversion device according to an exemplary embodiment of the present invention includes a light source; and a light conversion film provided on one surface of the light source. The light conversion film includes a first light conversion film containing one or more organic fluorescent dyes, and a second light conversion film disposed to be closer to the light source than the first light conversion film and containing one or more organic fluorescent dyes, and a maximum light emission wavelength of the second light conversion film is smaller than a maximum light emission wavelength of the first light conversion film when the light is irradiated from the light source. FIG. 1 illustrates a stacked structure of the light conversion device according to the exemplary embodiment of the present invention. In FIG. 1, the light conversion film is provided on one surface of the light source, and the light conversion film includes a transparent substrate, and first and second light conversion films provided on the transparent substrate and containing one or more organic fluorescent dyes. In FIG. 1, it is illustrated that the transparent substrate is in contact with the second light conversion film, but the transparent substrate may be disposed to be in contact with the first light conversion film. The transparent substrate may include a resin such as PET, but is not limited thereto. In FIG. 1, it is illustrated that the first light conversion film and the second light conversion film are disposed in contact with each other, but if necessary, an adhesive layer or a bonding layer may be provided therebetween.

The first or second light conversion film of the light conversion device may further include one or more organic fluorescent dyes and light diffusion particles which diffuse light incident from the light source from the inside of the light conversion film. The first or second light conversion film containing the light diffusion particles may be referred to as a first or second light conversion fluorescent diffusion film. Herein, the light diffusion particles may include $TiO_2$ or silica particles, but are not limited thereto. A structure of the light conversion device including the first or second light conversion film containing the light diffusion particles is illustrated in FIG. 2.

The light conversion device may include a light extraction plate instead of the light diffusion particles which diffuse the light incident to the first or second light conversion film in the light conversion film. The light conversion device may include the transparent substrate, the first and second light conversion films provided on one surface of the transparent substrate and containing one or more organic fluorescent dyes, and the light extraction plate stacked by the adhesive/bonding layer formed on the other surface of the transparent substrate, and a structure including the light extraction plate is illustrated in FIG. 3. The light extraction plate is to enhance conversion efficiency of the light conversion film and is not particularly limited so long as the light extraction plate is known in the art. In FIG. 3, the transparent substrate and the light extraction plate are disposed in contact with the second light conversion film, but if necessary, the transparent substrate and the light extraction plate may be disposed in contact with the first light conversion film. For example, the second light conversion film, the first light conversion film, the transparent substrate, the adhesive layer (alternatively, the bonding layer), and the light extraction plate may be sequentially stacked on the light source.

The light conversion film and/or the light conversion fluorescent diffusion film serves to convert light incident from the light source including a wavelength (color) selected from a visible light region into light having a specific wavelength (color) in the near ultraviolet. For example, the light conversion film may serve to convert light incident from the LED light source into white light and emit the white light. Herein, the light conversion film and/or the light conversion fluorescent diffusion film may include organic fluorescent dyes capable of implementing excellent color purity and color reproducibility. The organic fluorescent dyes have advantages of having higher quantum efficiency than existing quantum dots (QDs), easily controlling a desired emission wavelength, having emission line widths capable of achieving excellent color reproducibility, and having low cost.

The organic fluorescent dye may use a dye which absorbs light selected in the visible light region in the near ultraviolet light and emits light having a wavelength different from that of the absorbed light. For example, as the organic fluorescent dye, a green emission fluorescent dye having a maximum emission wavelength of 500 to 550 nm and/or a red emission fluorescent dye having a maximum emission wavelength of 600 to 660 nm may be used at least one or simultaneously. The organic fluorescent dye is not particularly limited, but may be acridine, xanthene, arylmethane, coumarin, polycyclic aromatic hydrocarbon, polycyclic heteroaromatic, perylene, pyrrole, and pyrene-based derivatives. The above materials are used as an example of the organic fluorescent dye, and various organic fluorescent dyes may be used, and the organic fluorescent dye is not limited thereto. Preferably, an organic fluorescent dye having a full width at half maximum (FWHM) of 60 nm or less and a molecular absorption coefficient of 50,000 to 150,000 $M^{-1} cm^{-1}$ may be used.

In this specification, the FWHM means a width of an emission peak when a maximum emission peak of the emitted light is half of a maximum height when light absorbed from an external light source is converted and emitted to light having a different wavelength. In this specification, the FWHM is measured in a film state. The FWHM of the emission peak in the film state of the organic fluorescent dye means a FWHM measured by irradiating light while the organic fluorescent dye is not a liquid state and is prepared in a film form alone or in combination with another component which does not affect measuring the FWHM, which is not a liquid state. More preferably, all fluorescent dyes dissolved in polar solvents are possible, and the fluorescent dyes are not classified into cationic, anionic and neutral dyes, but cationic or anionic organic fluorescent dyes are more preferred.

According to one example, the first light conversion film includes a red emission fluorescent dye having a maximum emission wavelength of 600 to 660 nm, and the second light conversion film includes a green emission fluorescent dye having a maximum emission wavelength of 500 to 550 nm. As a result, the light absorbed from a single color LED light source may be converted into white light by passing through a plurality of light conversion films or light conversion fluorescent diffusion films.

The light conversion film and/or light conversion fluorescent diffusion film may be a polymer film in which the organic fluorescent dyes and/or the light diffusion particles are distributed. For example, the light conversion film may include the organic fluorescent dye, a binder resin, and if necessary, a curable material of a composition including a polymerizable monomer and a polymerization initiator. The binder resin may use a photo-curing resin, a thermosetting resin, a thermoplastic resin, or the like, and it is preferable to use a water-soluble polymer. The binder resin may be used alone or in combination of two or more.

The light conversion film and/or the light conversion fluorescent diffusion film may be formed on a barrier film including a barrier layer (FIGS. 4 and 5). In FIGS. 4 and 5, a transparent substrate may serve as a buffer layer of the barrier layer. If necessary, an additional buffer layer may be provided and the transparent substrate may be omitted. In FIGS. 4 and 5, the structure in which the barrier layer and the transparent substrate are disposed in contact with the second light conversion film is illustrated, but if necessary, the barrier layer and the transparent substrate may be disposed in contact with the first light conversion film. For example, the second light conversion film, the second light conversion film, the barrier layer, and the transparent substrate may be stacked on the light source, and herein, the transparent substrate may be omitted.

The light conversion film and/or the light conversion fluorescent diffusion film may be stacked with a separate barrier film including a barrier layer by the adhesive/bonding layer (FIGS. 6 and 7). In FIGS. 6 and 7, the transparent substrate may serve as a buffer layer of the barrier layer. If necessary, an additional buffer layer may be provided and the transparent substrate may be omitted.

As illustrated in FIGS. 4 to 7, the barrier layer serves to prevent external moisture and oxygen from penetrating into the inside of the film. When the light conversion film containing the organic fluorescent dye absorbs light from the light source at a high temperature of room temperature or higher to convert the light into light having a different wavelength (color), the wavelength, the FWHM, conversion efficiency, and the like of the film may be changed over time by reacting with oxygen or water penetrating into the film. Therefore, in order to prevent a change in light characteristic of the film in the exemplary embodiment of the present invention, the barrier film is stacked on one surface or two surfaces of the light conversion film. According to an exemplary embodiment, the first light conversion film and the second light conversion film may include barrier films provided on surfaces opposite to the surfaces facing each other.

The permeability of oxygen and moisture in the barrier layer may be, for example, $10^{-1}$ cc/m²/day or less, respectively. This is described as an example of the barrier film, and oxygen and moisture permeability of the barrier layer may have different values therefrom.

The light conversion film may include a light extraction plate instead of the light diffusion particles to enhance the conversion efficiency of the light conversion film. As a result, the light conversion film may include the transparent substrate, the first and second light conversion films provided on the transparent substrate and containing one or more organic fluorescent dyes, and the light extraction plate stacked by the adhesive/bonding layer formed on the other surface of the transparent substrate (FIG. 8). Further, a separate barrier film including a barrier layer may be stacked on the light conversion film by the adhesive layer or the bonding layer (FIG. 9). In FIGS. 8 and 9, the transparent substrate may serve as a buffer layer of the barrier layer.

On the other hand, as illustrated in FIGS. 10 and 11, the first light conversion film or the first light conversion fluorescent diffusion film and the second light conversion film or the second light conversion fluorescent diffusion film may be spaced apart from each other, or be in contact with each other.

For example, other films may be interposed between the light conversion films or the light conversion fluorescent diffusion films. Alternatively, other films may be stacked with the second light conversion film or the second light conversion fluorescent diffusion film by the adhesive layer or the bonding layer provided on the first light conversion film or the first light conversion fluorescent diffusion film.

The first and second light conversion films may include a light extraction plate instead of the light diffusion particles to enhance the conversion efficiency of the light conversion film. In FIG. 10, the stacked structure of the light extraction plate is illustrated.

In FIGS. 1 to 11, the structure including two light conversion films and two light conversion fluorescent diffusion films is illustrated, but if necessary, three or more films may also be included.

According to one example, a composition for fabricating the light conversion film according to the exemplary embodiments of the present invention includes an organic fluorescent dye, and if necessary, light diffusion particles, a binder resin, a polymerizable monomer, and a polymerizable initiator. The polymerizable monomer may be used with the content of 10 to 30% with respect to the weight of the binder resin. The organic fluorescent dye may be used with the content of 0.001 to 5% with respect to the weight of the binder resin. The amount of the polymerizable initiator may be determined if necessary, and may be 0.01 to 20 wt % with respect to the weight of the solid content of the entire composition. The composition for preparing the light conversion film may further include a solvent if necessary, and for example, when the binder resin is water-soluble, water may be used as a solvent. The composition for preparing the light conversion film may be dissolved and used in the solvent, for example, water so that the solid content is 10 to 40 wt % of the entire composition solution.

As the binder resin, for example, poly(vinylalcohol), polyallylamine, or the like may be used, but the binder resin is not limited thereto. As the polyallylamine, polyallylamine (PAA) or polyallylamine hydrochloride (PAH) may be used, but the polyallylamine is not limited thereto. The poly(vinylalcohol) is poly(vinylalcohol) having a weight average molecular weight (Mw) of 85,000 to 146,000 and may be hydrolyzed by 96% or less. The polyallylamine may have a weight average molecular weight (Mw) of 58,000 to 900,000.

The polymerizable monomer is more preferably glycidyls, but is not limited thereto, and may use aldehydes, dialdehydes, isocyanates, alcohols, and the like.

In order to form the light conversion film, after the composition is coated on the transparent substrate, if necessary, curing or drying may be performed. In the case of performing curing after coating the composition, curing method and condition may be determined depending on a type of binder resin or other components.

The transparent substrate may include a resin such as PET or the like, but is not limited thereto, and may use a transparent plastic film or substrate known in the art.

According to an example, the light source is an edge type light source and may further include a light guide plate provided between the light source and the light conversion film. The light guide plate serves to diffuse the light received from the edge type light source. As another example, the light source is a direct type light source.

Another exemplary embodiment of the present invention provides a backlight unit including the light conversion device according to the aforementioned exemplary embodiments. The backlight unit may have a configuration known in the art except for the light conversion device. For example, a reflective plate may be provided on an opposite surface of the surface facing the light conversion device of the light source or the light guide plate, and a light collecting sheet, a brightness enhancing sheet, and the like may be additionally provided on an opposite side to the surface facing the light source or the light guiding plate of the light conversion film.

Yet another exemplary embodiment of the present invention provides a display device including the light conversion device or the backlight unit. The display device may have a configuration known in the art, except for the use of the light conversion device according to the above-described embodiments of the present application. For example, the display device may include a display module provided on one surface of the light conversion device or the backlight unit. The display module may be a liquid crystal module including a thin film transistor and a color filter.

Hereinafter, the exemplary embodiments of the present invention will be exemplified through Examples. However, the following Examples are just to exemplify the present invention and not limit the scope of the present invention.

Example 1

In a PVA solution in which 10 wt % of polyvinyl alcohol (PVA) was dissolved in water with respect to the weight of the entire solution, 0.3 part by weight of pyranine, which is a pyrene-based green fluorescent dye, and 3 parts by weight of a titanium oxide-based light diffusing agent with respect to 100 parts by weight of PVA were added and stirred to prepare a composition. The composition was coated on a plastic base so that a thickness after drying is 10 micrometers and then dried with hot air in a dry oven at 100° C. for 10 minutes to prepare a green light conversion film.

In the same manner, the composition prepared by adding and stirring 0.1 part by weight of sulfurodamine 101 with respect to 100 parts by weight of the PVA and a titanium oxide-based light diffusing agent was coated on the green light conversion film so that a thickness after drying was 10 micrometers and then dried with hot air in a dry oven at 100° C. for 10 minutes to prepare a white light conversion film.

The light conversion device prepared above was disposed so that the green light conversion film was close to the blue light source and then a spectrum of FIG. 12 was obtained by using PR-705 spectra scan equipment. A result of comparing a white color coordinate value (triangle) obtained from the spectrum of the light conversion device on the CIE 1976 coordinate with a white color coordinate value (circle) of a QDEF film by 3M Corporation was illustrated in FIG. 13.

Example 2

In a SAN solution in which 25 wt % of styrene-acrylonitrile copolymer (SAN) was dissolved in toluene with respect to the weight of the entire solution, 0.5 part by weight of BODIPY, which was a pyrrole-based green fluorescent dye, and 3 parts by weight of a titanium oxide-based light diffusing agent with respect to 100 parts by weight of the SAN were added and stirred to prepare a composition. The composition was coated on a plastic base so that a thickness after drying was 10 micrometers and then dried with hot air in a dry oven at 140° C. for 15 minutes to prepare a green light conversion film.

In the same manner, the composition prepared by adding and stirring 0.03 part by weight of BODIPY, which was the pyrrole-based green fluorescent dye and 3 parts by weight of the titanium oxide-based light diffusing agent with respect to 100 parts by weight of the SAN was coated on the green light conversion film so that a thickness after drying was 10 micrometers and then dried with hot air in a dry oven at 140° C. for 15 minutes to prepare a white light conversion film.

The light conversion device prepared above was disposed so that the green light conversion film was close to the blue light source and then a spectrum of FIG. 14 was obtained by using PR-705 spectra scan equipment.

A result illustrating the white color coordinate value obtained from the spectrum of the light conversion device on the CIE 1976 coordinate was illustrated in FIG. 15.

Comparative Example 1

By using the same composition and method as the Example 2, a red fluorescent dye composition was first coated on a plastic base to prepare a red light conversion film, a green fluorescent dye was coated on the red light conversion film to prepare a white light conversion device, and then the red light conversion film was disposed to be close to a blue light source, and a spectrum of FIG. 16 was obtained by using PR-705 spectra scan equipment. A result illustrating the white color coordinate value obtained from the spectrum of the light conversion device on the CIE 1976 coordinate was illustrated in FIG. 17.

When comparing the Example 2 and Comparative Example 1 using the same composition, it was verified that light conversion efficiency when the green light conversion film having a relatively short wavelength was close to the light source was 82% which was higher than 71% of the light conversion efficiency when the red light conversion film having a relatively long wavelength was close to the light source.

The invention claimed is:

1. A light conversion device, comprising:
   a light source; and
   a light conversion film provided on one surface of the light source,
   wherein the light conversion film includes a first light conversion film containing one first organic fluorescent dye, and a second light conversion film disposed to be closer to the light source than the first light conversion film and containing one second organic fluorescent dye, and a maximum light emission wavelength of the second light conversion film is smaller than a maximum light emission wavelength of the first light conversion film when the light is irradiated from the light source,
   wherein the second organic fluorescent dye of the second light conversion film is a green emission fluorescent dye having a maximum emission wavelength of 500 to 550 nm and the first organic fluorescent dye of the first light conversion film is a red emission fluorescent dye having a maximum emission wavelength of 600 to 660 nm, and
   wherein the organic fluorescent dye has a full width at half maximum (FWHM) of 60 nm or less and a molecular absorption coefficient of 50,000 to 150,000 $M^{-1}\,cm^{-1}$.

2. The light conversion device of claim 1, further comprising:
   a transparent substrate provided on a surface facing the light source of the first light conversion film or an opposite surface to the surface facing the first light conversion film of the second light conversion film.

3. The light conversion device of claim 2, wherein the transparent substrate comprises a barrier film provided on at least one surface of the first or second light conversion film.

4. The light conversion device of claim 3, wherein the transparent substrate is a barrier film provided on at least one surface of the first or second light conversion film.

5. The light conversion device of claim 2, further comprising:
   a light extraction plate provided on an opposite surface to the surface facing the light conversion film of the transparent substrate.

6. The light conversion device of claim 1, wherein the first or second light conversion film further includes light diffusion particles.

7. The light conversion device of claim 1, further comprising:
   barrier films provided on opposite surfaces to the surfaces where the first light conversion film and the second light conversion film face each other.

8. A backlight unit comprising the light conversion device of claim 1.

9. A display device comprising the backlight unit of claim 8.

* * * * *